United States Patent
Veeder et al.

(10) Patent No.: US 11,005,495 B1
(45) Date of Patent: May 11, 2021

(54) CHARGE TRANSFER CIRCUIT FOR COMPACT MODULATORS

(71) Applicant: Senseeker Engineering Inc., Santa Barbara, CA (US)

(72) Inventors: Kenton Veeder, Santa Barbara, CA (US); Nishant Dhawan, Santa Barbara, CA (US); Sean McCotter, Santa Barbara, CA (US)

(73) Assignee: SENSEEKER ENGINEERING, INC., Santa Barbara, CA (US)

( * ) Notice: Subject to any disclaimer, the term of this patent is extended or adjusted under 35 U.S.C. 154(b) by 0 days.

(21) Appl. No.: 16/840,198

(22) Filed: Apr. 3, 2020

Related U.S. Application Data

(60) Provisional application No. 62/832,521, filed on Apr. 11, 2019.

(51) Int. Cl.
| | | |
|---|---|---|
| *H03M 1/00* | (2006.01) | |
| *H03M 3/00* | (2006.01) | |
| *H03K 3/356* | (2006.01) | |
| *H04N 5/378* | (2011.01) | |

(52) U.S. Cl.
CPC ...... *H03M 3/458* (2013.01); *H03K 3/356017* (2013.01); *H04N 5/378* (2013.01)

(58) Field of Classification Search
CPC .. H03M 1/747; H03M 1/0604; H03M 1/0863; H03M 1/068; H03M 1/52; H03M 1/74; H03M 1/742; H03M 1/808; H03F 3/45179; H03F 3/45475; H03F 3/72; H03F 2200/451; H03F 3/2173; H03F 3/217; H03F 1/0227; H03F 3/24; H03F 1/0205; H03F 3/2171; H03F 1/02; H03F 2200/03
USPC .................................. 341/136, 143, 144
See application file for complete search history.

(56) References Cited

U.S. PATENT DOCUMENTS

| | | | |
|---|---|---|---|
| 5,348,971 A | 9/1994 | Clemence et al. | |
| 5,659,315 A | 8/1997 | Mandl | |
| 7,023,369 B2 | 4/2006 | Bocko et al. | |
| 8,493,251 B2* | 7/2013 | Riches | H03M 1/0863 341/120 |
| 9,806,730 B1* | 10/2017 | Dusad | H03M 1/08 |
| 9,866,227 B1* | 1/2018 | Bresciani | H03M 1/46 |

(Continued)

OTHER PUBLICATIONS

Boyd Fowler, "CMOS Area Image Sensors with Pixel Level A/D Conversion", Ph.D. dissertation, 1995, p. 65, Fig. 6.1.

(Continued)

*Primary Examiner* — Linh V Nguyen

(74) *Attorney, Agent, or Firm* — Hsuanyeh Law Group, PC

(57) ABSTRACT

The present disclosure provides a current generation circuit. In one aspect, the circuit includes a current source transistor and a current sink transistor connected to the current source transistor in series, with respective sources of the current source and sink transistors being connected with each other at a common node. A voltage difference between respective gates of the current source and sink transistors defines a current value flowing through the series, the voltage difference being variable such that the current value is either time-dependent or time-independent. Respective drains of the current source and sink transistors provide a high resistance output necessary to provide a current source or sink function thereby rejecting influence of drain variation or error on the current value.

27 Claims, 4 Drawing Sheets

(56) References Cited

U.S. PATENT DOCUMENTS

| | | | | |
|---|---|---|---|---|
| 10,205,423 | B1* | 2/2019 | Zanetta | H03F 3/3016 |
| 10,425,100 | B1* | 9/2019 | Vaturi | H03M 3/438 |
| 2009/0037855 | A1* | 2/2009 | Tanefusa | G06F 30/3312 |
| | | | | 716/106 |
| 2011/0210355 | A1* | 9/2011 | Yamazaki | H01L 29/78693 |
| | | | | 257/98 |
| 2013/0027092 | A1* | 1/2013 | Bien | H03K 19/00 |
| | | | | 327/109 |
| 2015/0070086 | A1* | 3/2015 | Tan | G11C 5/147 |
| | | | | 327/540 |
| 2015/0188537 | A1* | 7/2015 | Isoda | H03K 17/6872 |
| | | | | 327/108 |
| 2016/0056813 | A1* | 2/2016 | Vice | H03G 1/0094 |
| | | | | 330/297 |
| 2016/0379564 | A1* | 12/2016 | Inoue | G09G 3/2011 |
| | | | | 345/212 |
| 2017/0350756 | A1* | 12/2017 | Panicacci | G01J 1/44 |
| 2018/0014123 | A1* | 1/2018 | Shajaan | H04R 3/04 |
| 2019/0165735 | A1* | 5/2019 | Fikstvedt | H03F 3/245 |
| 2019/0372580 | A1* | 12/2019 | Shen | H03M 1/0863 |

OTHER PUBLICATIONS

Christer Jansson, "A High-Resolution, Compact, and Low-Power ADC Suitable for Array Implementation in Standard CMOS", IEEE Transactions on Circuits and Systems-I: Fundamental Theory and Applications, vol. 42, No. 11, Nov. 1995, p. 904-912.

Brian Tyrell et al. "Time Delay Integration and In-Pixel Spatiotemporal Filtering Using a Nanoscale Digital CMOS Focal Plane Readout" IEEE Trans. on Electron Devices, vol. 56, No. 11, Nov. 2009, p. 2516-2523.

* cited by examiner

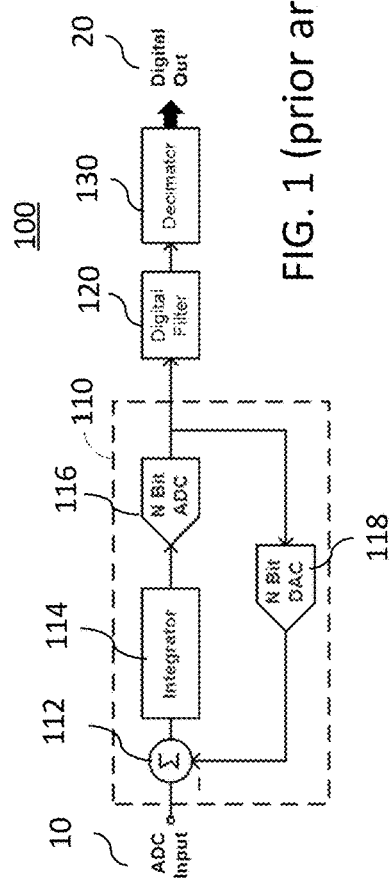
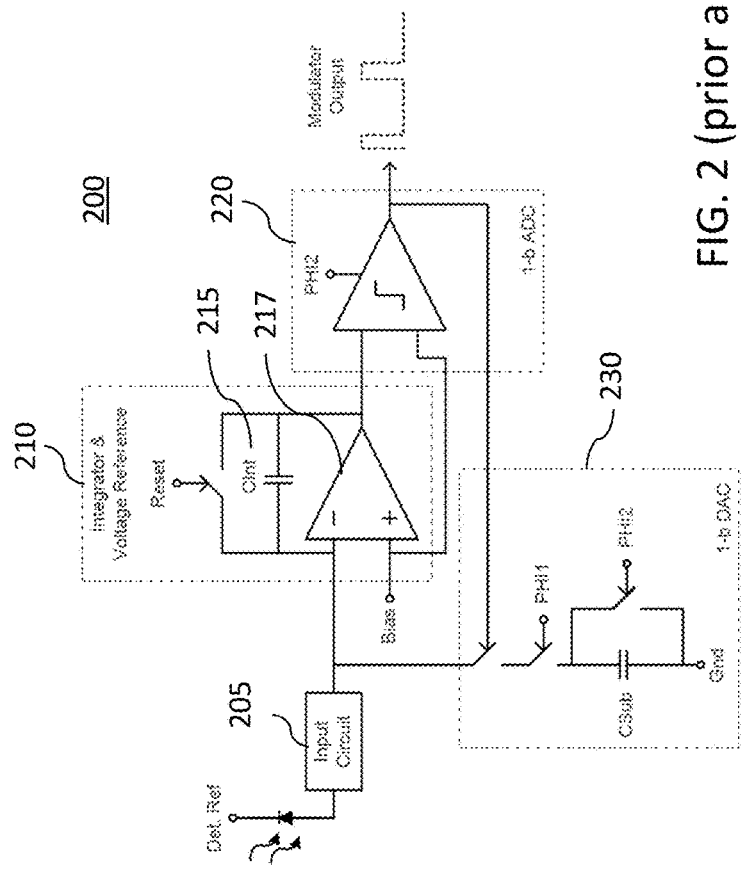

CHARGE TRANSFER CIRCUIT FOR COMPACT MODULATORS

TECHNICAL FIELD

The present disclosure relates to a charge transfer circuit for signal modulation. This type of modulation is found in some Delta-Sigma and Frequency Modulators used in analog-to-digital converters (ADCs), analog counters and analog computers. More specifically, the present disclosure relates to a charge transfer circuit for signal modulation using charge packet transfer. The circuit disclosed herein may be the smallest forms of these types of circuits used for digital pixels inside digital pixel image sensors and other arrayed computation engines, such as neural network chips.

BACKGROUND

Delta-Sigma ($\Delta\Sigma$) modulation ADCs (or Sigma-Delta modulation) comprise a large family of ADCs used primarily to achieve high dynamic range through oversampling and filtering. They are used almost exclusively when greater than 18 bits of resolution are needed for an application. As shown in FIG. 1, a $\Delta\Sigma$ ADC 100 contains a signal subtraction circuit 112, an integrator 114, an N bit ADC 116, an N bit feedback DAC 118, a digital filter 120, and a digital decimator 130.

Signal subtraction circuit 112, integrator 114, N bit ADC 116, and N bit feedback DAC 118 make up a Delta-Sigma Modulator (DSM) 110. DSM 110 allows a delayed version of input signal 10 to pass through the modulator while subtracting a delayed version of the quantization error from the present quantization error (including uncorrelated noise). The delay in output signal 20 and the subtracted quantization error is a single sample time. As the sample rate increases with respect to the frequency of input signal 10, the delayed version of the quantization error approaches the current version of the quantization error and the difference between the two gets very small. The error whose frequency is low enough for this to work is called in-band noise. In this way, error is suppressed as sampling frequency increases while the signal is passed through with no compression. This noise suppression in the pass-band is called noise shaping.

DSMs can fit within an imaging pixel, with or without the digital filter and decimation, as discussed by Mandl (U.S. Pat. No. 5,248,971). These modulators are very useful for creating high dynamic range image sensors. The in-pixel DSM can be composed of an integrating capacitor, comparator (single-bit ADC) and a charge subtraction circuit (single-bit DAC). Conventional approaches for the DSM can be found in in Fowler (See, page 65, FIG. 6.1 of his 1995 Ph.D. dissertation), captured in block diagram in FIG. 2 and implemented completely inside the pixel. As shown in FIG. 2, DSM 200 comprises an integrator circuit 210 including an integration capacitor 215 (having a capacitance of Cint) that receives analog signals from an input circuit 205, a comparator (or single-bit ADC) 220, and a charge subtraction circuit (or single-bit DAC) 230. Charge subtraction circuit 230 can pull charge off the input node of amplifier 217 at very high speed, amplifier 217 must work even faster for certain applications.

The $\Delta\Sigma$ digital pixel modulator has some very nice features. The first feature is that DSM pixels are very compatible with Extended Counting. Extended Counting is a technique to pull out additional information from the charge left on the integration capacitor after the last modulator sample operation. This was adapted for $\Delta\Sigma$ image sensors in 1995 by Christer Jansson using a first order modulator followed by a successive approximation residue conversion (see, Jansson, Christer. "A High-Resolution, Compact, and Low-Power ADC Suitable for Array Implementation in Standard CMOS." IEEE Trans. on Circuits and Systems, vol. 42, no. 11, pp. 904-912, November 1995). Jansson achieved 16 bits of resolution with 0.41 LSBs of noise with this approach without any trimming or correction.

Another useful feature is that the $\Delta\Sigma$ algorithm is able to filter or cancel comparator error from the 1-b ADC operation if there is a large number of samples or if Extended Counting is employed. This allows a much smaller and lower power comparator to be used as the decision circuit compared to some of the other high dynamic range modulation schemes used in-pixel such as pulse frequency modulators (PFM). Comparators as simple as an inverter can be employed in the DSM pixel and still achieve good performance. The rejection of comparator error makes the $\Delta\Sigma$ circuit relatively immune to comparator power supply variation and even comparator decision level variation for large numbers of samples or with Extended Counting operation. The $\Delta\Sigma$ pixel's full-scale range must simply be large enough to contain the error without saturating or shutting off its components.

Another advantage of the $\Delta\Sigma$ digital pixel over some other modulators (PFM, for example) is its synchronous nature. At first glance, this might appear to be a disadvantage because the PFM is capable of accepting extremely high input magnitudes, limited only by the oscillator's loop time constant or by practical issues such as supply management and power consumption. However, the synchronous nature of the $\Delta\Sigma$ digital pixel allows many of the DSM components to be integrated outside the pixel. This allows this architecture to be used in much smaller pixels at the cost of synchronous array clocks running at the global or, as is more common, the row level.

A later patent by Mandl (U.S. Pat. No. 5,659,315) provides a similar approach to FIG. 2 but moves the ADC circuitry outside the pixel (FIGS. 13, 15-17 of U.S. Pat. No. 5,659,315). Mandl still requires the similar charge subtraction circuit and a high gain transimpedance amplifier integrator to act as the modulator integrator and reference for the 1-b DAC.

Other more recent approaches to the DSM can be found in Bocko (U.S. Pat. No. 7,023,369) in which all of the circuitry except for a portion of the integrator and charge subtraction circuit is moved outside the pixel to reduce pixel size and power consumption. The charge subtraction circuit is reconstructed to be a fixed current over the pixel access time instead of a fixed packet of charge transferred at high speed as is done in FIG. 2. Bocko and company are able to greatly reduce the pixel size, but there is a number of key problems remaining with all of these approaches which the present invention solves.

DSMs are usually used to increase the dynamic range of the image sensor. For many applications, they should be capable of integrating very high signal current in a short amount of time using a fast modulator sample rate. The circuit in FIG. 2 cannot operate nearly as fast as some applications need. The 1-b DAC is capable of pulling charge off the input node of the amplifier at very high speed, but the amplifier must work even faster to compensate for this high-speed charge transfer or risk changing the bias on the detector too much. This detector bias spike may not be a problem for very high impedance silicon detectors, but it is a huge problem for infrared and scientific detector materials which may have very low impedance. These detectors produce vastly different signal currents under the same light"

conditions if the bias voltage across them changes too much. This is very difficult to calibrate out of an image and may severely limit performance of a sensor system.

The 1-b DAC charge transfer mechanism can also be problematic when there is a large array of modulators operating in parallel. The charge transfer circuit can reset in a closed-loop fashion, using PHI2, without disturbing the Gnd level very much. However, as soon as PH1 closes to transfer charge off the integrator input node, the rush of current causes a severe positive voltage spike in the ground connection. For this reason, some designs limit the current through the PHI1 charge transfer switch to help minimize this supply spike. This effect slows the rate at which the circuit can complete a charge transfer operation and places an upper limit on DSM sample rate. A slower sample rate also prevents the circuit from working with very high signal levels over a very short integration time for a particular DSM resolution.

An array of DSMs working together may be clocked in a row-wise or column-wise fashion, with only a few rows or columns being clocked at once. This helps to prevent supply spiking from all modulators trying to run a sample at one time. The clocks scan through the array of modulators and complete a single sample clock cycle for all modulators. Each modulator has only a very short amount of time to complete its charge transfer operation before the clock is moved to a different group of modulators. This means that waiting for a controlled charge transfer in order to not spike Gnd or adversely bias the detector greatly slows down the maximum speed of the clock, limiting the minimum signal integration time. The modulator has much more time to reset the transferred charge mechanism than it does to actually perform the charge transfer.

Bocko's approach is targeted at reducing the circuit size to make the modulator compatible with small pixel image sensors. It partially solves the large array power consumption problem by keeping all active DC power consuming circuitry outside the pixel. However, it creates even bigger problems for high speed integration and high signals because the integrated voltage must fully settle on high capacitance readout lines, which are shared by many pixels, in order to properly subtract a fixed amount of current from the accessed pixel. Signal subtraction schemes such as this using current as the subtracted signal over a fixed time interval (as opposed to charge transfer mechanisms) are also more susceptible to modulator clock jitter because this jitter is directly injected into the magnitude of the subtracted signal. Running the modulator clock faster to achieve fast integration times for a given ADC resolutions exacerbates this problem by increasing the magnitude effect of clock jitter on the subtracted signal magnitude. This uncertainty results in higher modulator noise and lower over-all signal-to-noise ratio for a particular modulator oversampling ratio.

SUMMARY

A power supply and error rejecting current bias for pulsed charge packet generation is described herein which can provide much lower error for arrayed elements and correspondingly higher signal-to-noise ratio as a function of number of subtracted packets. This is especially useful for digital pixel sensors for Delta-Sigma and other forms of charge packet subtraction Modulation. It is also useful for any type of arrayed small element analog calculation such as analog counters and general adder/subtractor circuits.

The invention provides a mechanism to transfer a fixed packet of charge on or off a capacitor using a current generation element. This mechanism replaces the '1-b DAC' and the active amplifier and reference shown in the 'Integrator & Voltage Reference' used in the prior art (see FIG. 2) to provide a fixed charge transfer. The invention is highly resistant to the influence of DC resistance drops in distributed supplies or dynamic supply movements which otherwise would inject unwanted error in the charge packet. The magnitude of the charge packet is set with both the current source or sink magnitude, set by the difference in gate bias between the source or sink transistors, and by the duration of time the current flows. The invention can be integrated into large arrays of elements, such as those found in image sensing pixel arrays, and reject supply droop which would change the value of the current across the array for conventional current source or sinks. The invention also provides a means for eliminating charge memory by forcing hard resets of nodes which would otherwise settle out in a sub-threshold logarithmic fashion.

Compared to the prior art, this charge packet generator is smaller in size, allows bi-directional operation for addition or subtraction of charge, and rejects supply-induced error. DSM digital pixels created with this invention experience higher signal-to-noise ratios for higher signals and more room inside fixed pixel areas for larger integration capacitances. Analog counters made with this invention may have smaller count steps for noiseless operation and, therefore, less complex circuit implementations vs. count.

BRIEF DESCRIPTION OF THE DRAWINGS

FIG. 1 illustrates a conventional Single-stage Delta-Sigma ADC.

FIG. 2 illustrates a conventional DSM for pixel-level implementation.

DETAILED DESCRIPTION

Figure 4:
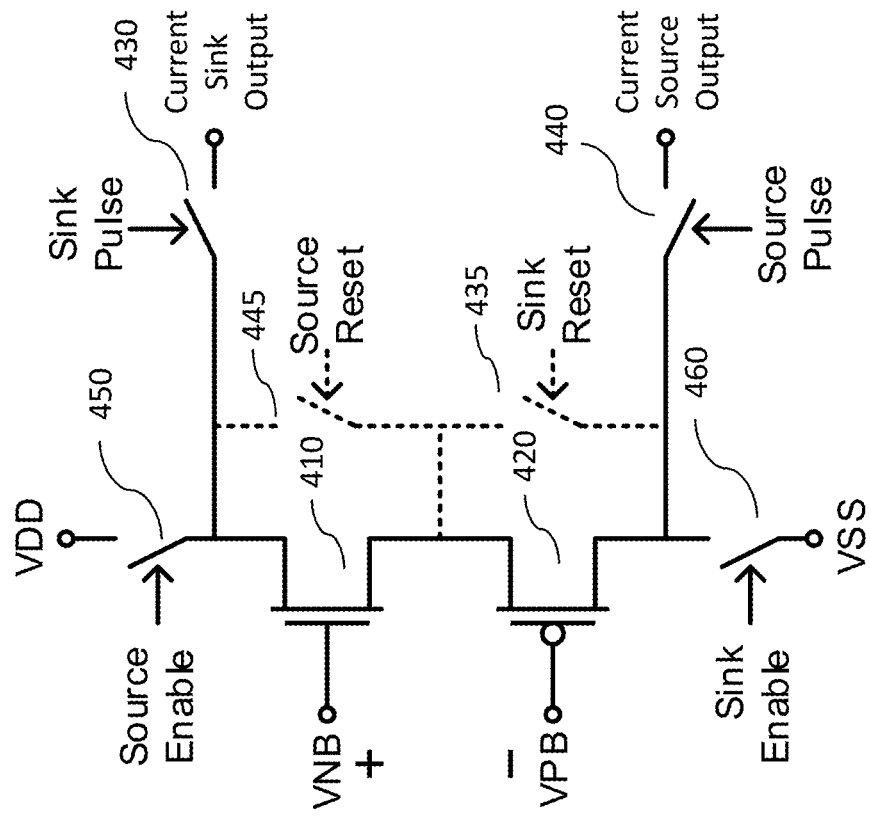
FIG. 4 illustrates a bi-directional current sink or source embodiment of a charge transfer circuit of the invention with dotted line representing optional reset switches. Note that the present disclosure assumes VNB-VPB≥0 V and VDD≥VSS.
Figure 3:
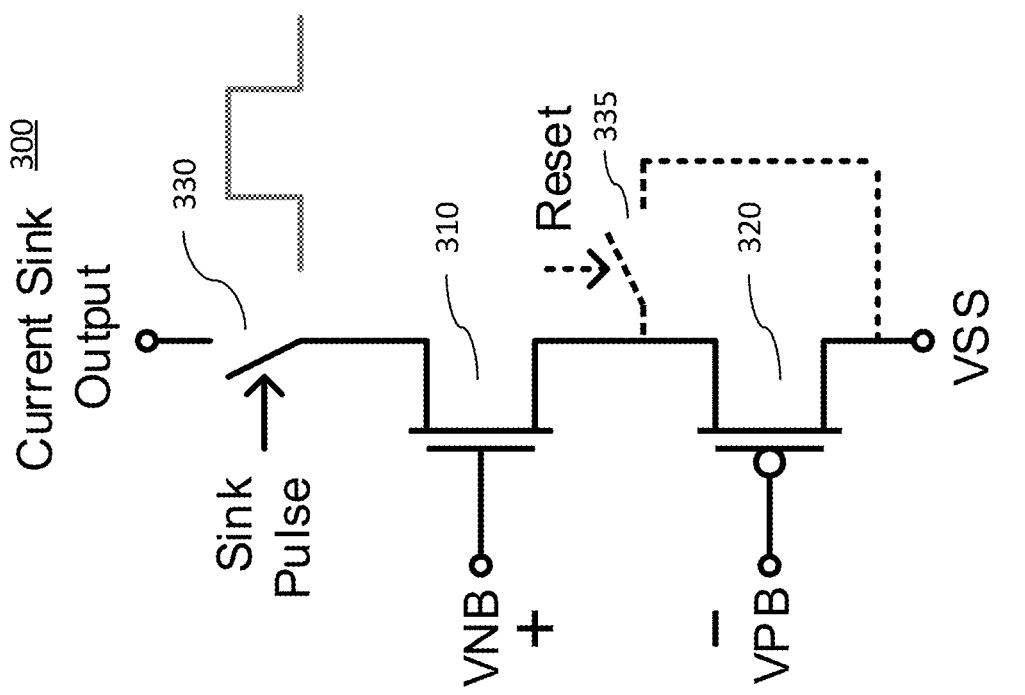
FIG. 3 illustrates a current sink embodiment of a charge transfer circuit of the invention with dotted line representing an optional reset switch. Note that the present disclosure assumes VNB-VPB≥0 V and Current Sink Output voltage≥VSS.

FIG. 3 illustrates a charge transfer circuit 300 in accordance with a current sink embodiment of the present invention. FIG. 4 illustrates a charge transfer circuit 400 in accordance with a bi-directional current sink or source embodiment of the present invention. It is appreciated that the embodiment of FIG. 3 may also be implemented as a current source.

Referring to FIG. 3, charge transfer circuit 300 (e.g., a floating current generator) comprises an NMOS FET transistor 310 and a PMOS FET transistor 320, which are placed in a push-pull configuration, with sources of both NMOS FET transistor 310 and PMOS FET transistor 320 being electrically connected to each other. Current flowing through NMOS FET transistor 310 and PMOS FET transistor 320 is set almost exclusively by the gate biases VNB and VPB and remains mostly independent of supply voltage VSS or the voltage on the Current Sink Output node. This independence is a function of the output resistance looking into the drain of each MOSFET 310, 320. In one embodiment, drains of NMOS FET transistor 310 and PMOS FET transistor 320 provide a high resistance output, typically greater than 100 kΩ, necessary to provide a current source or sink function, thereby rejecting influence of drain variation or error on the current value. It is also predicated on the condition that either node must be away from the transistor's drain saturation voltage (VDSat) so that the MOSFET is operating in the saturation region, not the linear region. This circuit may then provide 40-60 dB or more of rejection to variation in either the VSS node or the output node as long as these two criteria are met.

An additional switch 330 may be added to act as the dynamic Sink or Source Pulse control. It is appreciated that the gate biases, VNB or VPB may also be used to control the current flow, but in this particular embodiment, designed to fit within remote elements with local dynamic control of the pulse, it is desirable to have an extra switch.

The dotted lines in FIG. 3 represent an optional reset switch 335. Switch 335 is responsible for turning on sometime after the current pulse completes and bringing the sources of both transistors to VSS which would also pull down the floating side of the Sink Pulse switch to VSS. This effectively eliminates the logarithmic source voltage reduction towards VSS, as the PMOS FET transistor 323 enters deep sub-threshold region. This logarithmic sub-threshold operation may otherwise act as a source of charge memory and error, especially for fast Sink Pulse revisit times or frequencies.

Referring to FIG. 4, charge transfer circuit 400 comprises an NMOS FET transistor 410 and a PMOS FET transistor 420 with sources of NMOS FET transistor 410 and PMOS FET transistor 420 being connected to each other. Charge transfer circuit 400 may comprise switches 430 and 440 to act as the dynamic Sink and Source Pulse control. Charge transfer circuit 400 further comprises switches 450 and 460 to enable a bi-directional (current sink or source) operation.

In one embodiment, switch 430 is electrically coupled between the drain of NMOS FET transistor 410 and the current sink output, while switch 440 is electrically coupled between the drain of PMOS FET transistor 420 and the current source output. In one embodiment, switch 450 is electrically coupled between the drain of NMOS FET transistor 410 and drain supply VDD, while switch 460 is electrically coupled between the drain of PMOS FET transistor 420 and source supply VSS.

The dotted lines in FIG. 4 represent optional reset switches 435 and 445. Switches 435 and 445 are responsible for turning on sometime after the current pulses at switches 430 and 440 complete and bringing the sources of both transistors 410 and 420 to VSS or VDD depending on whether switch 450 or 460 are enabled.

Figure 5:
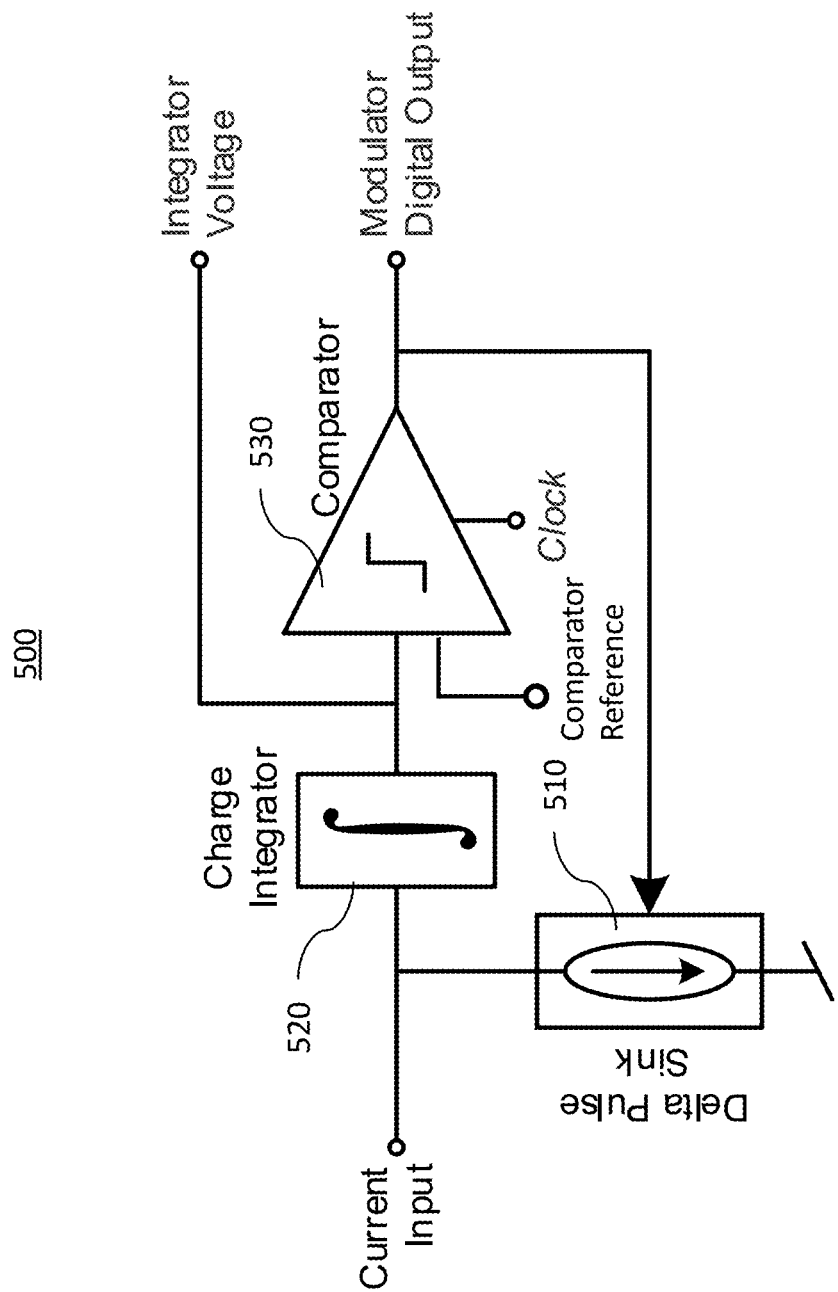
FIG. 5 illustrates a first-order Delta-Sigma Modulator implementation including the charge transfer circuit of FIG. 3.

FIG. 5 illustrates a first-order Delta-Sigma Modulator (DSM) 500 including a delta pulse sink generator 510. This implementation is compatible with very small repetitive elements.

In one embodiment, delta pulse sink 510 is charge transfer circuit 300 of FIG. 3. Charge integrator 520 may be as simple as a capacitor or it may be an active capacitive transimpedance amplifier. Comparator 530 may be clocked and created from a few transistors which run off of a uniform and repetitive Clock such as that shown in FIG. 6. This structure is very compatible with arrays of digital pixels.

Typically, the Modulator Digital Output runs to an accumulation or decimation mechanism, which may be as simple as a counter.

Figure 6:
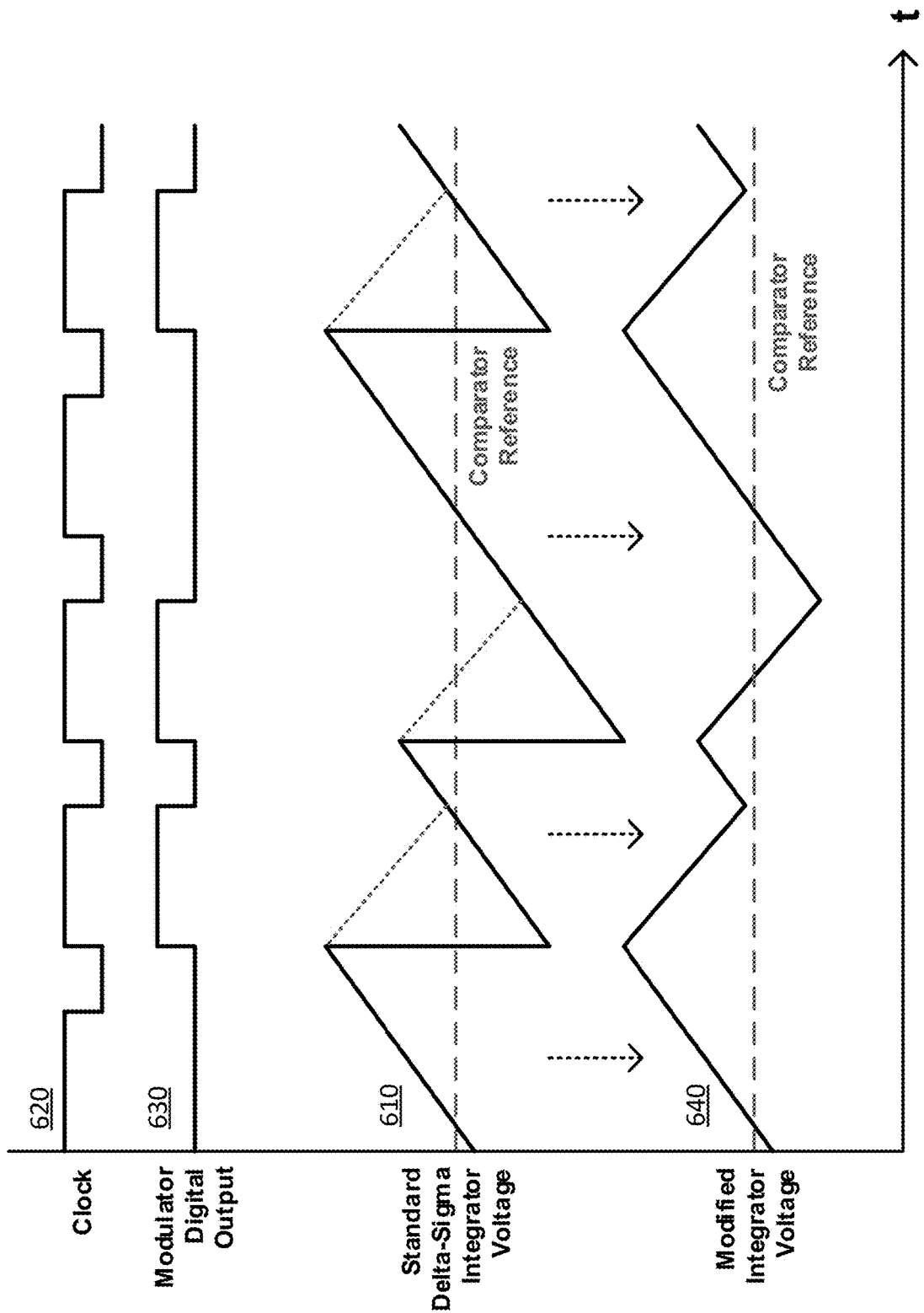
FIG. 6 illustrates waveforms for operating the first-order DSM of FIG. 5.

Referring to both FIGS. 5 and 6, current is injected into the Current Input and may come from some form of transducer element (such as, a photonic detector) or other processing elements (such as, an operational transconductance amplifier, current conveyor or mirror, a comparator, an amplifier, a feedback circuit, a memory circuit, a neighboring circuit, an external array of repetitive circuits, a controller, a pattern generator, and an analog arithmetic logic unit, etc.). In this example, the current direction flows into integrator 520 and the integration output voltage 610 increases, as shown in FIG. 6. At some point in time, a positive edge of Clock 620 arrives at comparator 530 which decides that the integrator voltage is above some Comparator Reference and the comparator output 630 toggles high. Because the output of comparator 530 is electrically coupled to the Sink Pulse switch of delta pulse sink 510 (or switch 330 of charge transfer circuit 300 in FIG. 3), this enables the Sink Pulse switch and allows charge to start flowing through the Delta Pulse Sink circuit 510. In the prior art, this typically triggers a capacitive charge transfer which would have a very sharp transition edge in time. In this invention, the delta pulse enables a controlled flow of current which continues to flow and discharge the integrator voltage for as long as the Comparator Clock 620 remains high. The resultant waveform 640 for this type of Delta circuit is shown at the bottom of FIG. 6 and labeled Modified Integrator Voltage.

One of the key benefits of the invention is rejection of errors associated with reference supplies. The current Delta Pulse Sink mechanism adds shot noise power to the results which would almost double the shot noise power over that inherent in the incoming Current Input. However, this noise still scales by the square root of the incoming Current Input and allows signal-to-noise (SNR) to increase. Typical Delta generation circuits may achieve only lower SNR vs. input signal due to supply, bias or settling errors associated with their Delta mechanisms (see, for example, Tyrrell, Brian et al. "Time Delay Integration and In-Pixel Spatiotemporal Filtering Using a Nanoscale Digital CMOS Focal Plane Readout." IEEE Trans. on Electron Devices, vol. 56, no. 11, pp. 2516-2523, November 2009). This invention ultimately increases high signal SNR by the bias movement rejection, which may be an additional 40-60 dB, even for larger arrays of elements, as long as other error sources such as element cross-talk are minimized.

Another key benefit of the invention is that the charge pulse is subtracted slowly over an extended period of time. This may provide benefit for cases where voltage movement on the Current Input node cannot be tolerated. For example, if a current generator has poor output resistance and is connected to the Current Input node, each delta pulse would tend to feed back through the Charge Integrator and change the voltage on the Current Input. High power amplifiers inside capacitive transimpedance amplifier charge integrators may be required to hold the Current Input stable. Slowing down the change on the Integrator Voltage greatly reduces the amount of power the capacitive transimpedance amplifier needs to consume in order to hold the Current Input stable during each Delta event.

The invention also provides continuous control of the charge pulse magnitude through either waveform timing or VNB-VPB bias settings. Prior art associated with capacitive Delta circuits can only change the present voltage across their capacitors to change the Delta size, and this is usually limited by other things in the circuit system. This invention allows multi-gain DSM integrators by simply changing the Delta Pulse Sink charge package size and selecting a particular integration capacitor size with no more overhead than a conventional multi-gain analog integrator pixel.

Moreover, the current generation circuit of the present disclosure can be used in a prioritizing and weighting circuit to set weighting for a neuromorphic system, for example. This can be done by applying some weighting from a control signal in the pixel (similar to an integrator or buffer amplifier that can provide multiple levels) and use it to set the amount of charge that is dumped on a capacitor when a query pulse comes through. Such a circuit can weight decisions in an analog system that needs to "learn" and "forget."

For the purposes of describing and defining the present disclosure, it is noted that terms of degree (e.g., "substantially," "slightly," "about," "comparable," etc.) may be utilized herein to represent the inherent degree of uncertainty that may be attributed to any quantitative comparison, value, measurement, or other representation. Such terms of degree may also be utilized herein to represent the degree by which a quantitative representation may vary from a stated reference (e.g., about 10% or less) without resulting in a change in the basic function of the subject matter at issue. Unless otherwise stated herein, any numerical value appearing in the present disclosure are deemed modified by a term of degree (e.g., "about"), thereby reflecting its intrinsic uncertainty.

Although various embodiments of the present disclosure have been described in detail herein, one of ordinary skill in the art would readily appreciate modifications and other embodiments without departing from the spirit and scope of the present disclosure as stated in the appended claims.

What is claimed is:

1. A current generation circuit, comprising:
   a current source transistor; and
   a current sink transistor connected to the current source transistor in series, with respective source terminals of the current source and sink transistors being connected with each other at a common node;
   wherein a voltage difference between respective gate terminals of the current source and sink transistors defines a current value flowing through the series, the voltage difference being variable such that the current value is either time-dependent or time-independent;
   wherein respective drain terminals of the current source and sink transistors provide a high resistance output necessary to provide a current source or sink function, thereby rejecting influence of drain variation or error on the current value; and
   wherein one of the drain terminals of the series of the current source and sink transistors is connected to a current input.

2. The circuit of claim 1, further comprising:
   a transistor switch connected between the current input and said one of the drain terminals of the series of the current source and sink transistors to control either a source current or a sink current with a time-varying signal; and
   a supply voltage connected to the other one of the drain terminals of the series of the current source and sink transistors so as to provide charge flow.

3. The circuit of claim 2, wherein charge memory associated with the common node is set through manipulation of a gate voltage of the transistor switch between time varying current pulse events.

4. The circuit of claim 2, wherein charge memory associated with the common node is set using at least a reset element connected between the common node and the supply voltage.

5. The circuit of claim 2, wherein an amount of charge transferred through the series is set by both the time-varying signal and the voltage difference.

6. A delta-sigma modulator, containing the circuit of claim 1.

7. An analog counter circuit for increment or decrement counting, containing the circuit of claim 1.

8. A prioritizing and weighting circuit containing the circuit of claim 1.

9. An array of repetitive circuits containing the circuit of claim 1, the array of repetitive circuits being configured to process signals from sensing transducers.

10. The array of claim 9, wherein the signals are processed using Delta-Sigma Modulation.

11. The array of claim 9, wherein the sensing transducers comprise photon-sensitive detectors.

12. An array of repetitive circuits containing the circuit of claim 1, the array of repetitive circuits being configured to process signals from at least one of a comparator, an amplifier, a feedback circuit, a memory circuit, a neighboring circuit, an external array of repetitive circuits, a controller, a pattern generator, and an analog arithmetic logic unit.

13. The circuit of claim 1, wherein the current source transistor comprises a p-type transistor and the current sink transistor comprises an n-type transistor.

14. The circuit of claim 9, wherein the p-type and n-type transistors are MOSFET.

15. A current generation circuit, comprising:
    a current source transistor;
    a current sink transistor connected to the current source transistor in series, with respective source terminals of the current source and sink transistors being connected with each other at a common node; and
    first and second transistor switches each being connected to a respective one of drain terminals of the series of the current source and sink transistors, such that either a source current or a sink current is utilized through selectable and time-varying input control signals sent to the first and second transistor switches;
    wherein a voltage difference between respective gate terminals of the current source and sink transistors defines a current value flowing through the series, the voltage difference being variable such that the current value is either time-dependent or time-independent;
    wherein respective drain terminals of the series of the current source and sink transistors provide a high resistance output necessary to provide a current source or sink function, thereby rejecting influence of drain variation or error on the current value; and
    wherein at least one of the drain terminals of the series of the current source and sink transistors is connected to a current input through a respective one of the first and second transistor switches.

16. The circuit of claim 15, wherein charge memory associated with the common node is set through manipulation of a gate voltage of the first and second transistor switches between time varying current pulse events.

17. The circuit of claim 15, wherein an amount of charge transferred through the series is set by both the time-varying input control signal and the voltage difference.

18. The circuit of claim 15, wherein charge memory associated with the common node is set using at least a reset element connected between the common node and a supply voltage connected to the other one of the drain terminals of the series of the current source and sink transistors.

19. A delta-sigma modulator, containing the circuit of claim 15.

20. An analog counter circuit for increment or decrement counting, containing the circuit of claim 15.

21. A prioritizing and weighting circuit containing the circuit of claim 15.

22. An array of repetitive circuits containing the circuit of claim 12, the array of repetitive circuits being configured to process signals from sensing transducers.

23. The array of claim 22, wherein the signals are processed using Delta-Sigma Modulation.

24. The array of claim 22, wherein the sensing transducers comprise photon-sensitive detectors.

25. An array of repetitive circuits containing the circuit of claim 15, the array of repetitive circuits being configured to process signals from at least one of a comparator, an amplifier, a feedback circuit, a memory circuit, a neighboring circuit, an external array of repetitive circuits, a controller, a pattern generator, and an analog arithmetic logic unit.

26. The circuit of claim 15, wherein the current source transistor comprises a p-type transistor and the current sink transistor comprises an n-type transistor.

27. The circuit of claim 26, wherein the p-type and n-type transistors are MOSFET.

* * * * *